United States Patent [19]
Plants et al.

[11] Patent Number: 6,049,487
[45] Date of Patent: *Apr. 11, 2000

[54] EMBEDDED STATIC RANDOM ACCESS MEMORY FOR FIELD PROGRAMMABLE GATE ARRAY

[75] Inventors: William C. Plants, Santa Clara, Calif.; James Dean Joseph, Monument, Colo.; Antony G. Bell, Los Gatos, Calif.

[73] Assignee: Actel Corporation, Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/039,891

[22] Filed: Mar. 16, 1998

[51] Int. Cl.⁷ .............................. G11C 16/04; G11C 8/00
[52] U.S. Cl. ................................ 365/189.04; 365/230.05
[58] Field of Search ........................ 365/189.04, 230.05, 365/189.01, 189.08, 230.03

[56] References Cited

U.S. PATENT DOCUMENTS

| | | | |
|---|---|---|---|
| 4,930,097 | 5/1990 | Ledenbach et al. | 364/716 |
| 5,187,392 | 2/1993 | Allen | 307/465 |
| 5,198,705 | 3/1993 | Galbraith et al. | 307/465 |
| 5,208,491 | 5/1993 | Ebeling et al. | 307/465 |
| 5,222,066 | 6/1993 | Grula et al. | 371/21.1 |
| 5,365,485 | 11/1994 | Ward et al. | 365/221 |
| 5,375,089 | 12/1994 | Lo | 365/189.04 |
| 5,744,979 | 4/1998 | Goetting | 326/39 |
| 5,744,980 | 4/1998 | McGowan et al. | 326/40 |
| 5,801,547 | 9/1998 | Kean | 326/40 |
| 5,809,281 | 9/1998 | Steele et al. | 395/497.01 |
| 5,815,003 | 9/1998 | Pedersen | 326/39 |
| 5,815,004 | 9/1998 | Trimberger et al. | 326/41 |
| 5,821,776 | 10/1998 | McGowan | 326/41 |
| 5,825,200 | 10/1998 | Kolze | 326/38 |
| 5,825,201 | 10/1998 | Kolze | 326/39 |
| 5,825,202 | 10/1998 | Tavana et al. | 326/39 |
| 5,825,662 | 10/1998 | Trimberger | 364/491 |
| 5,828,230 | 10/1998 | Young | 326/41 |
| 5,828,538 | 10/1998 | Apland et al. | 361/56 |
| 5,831,448 | 11/1998 | Kean | 326/41 |
| 5,835,998 | 11/1998 | Pedersen | 326/40 |
| 5,838,167 | 11/1998 | Erickson et al. | 326/38 |
| 5,838,584 | 11/1998 | Kazarian | 364/491 |
| 5,838,954 | 11/1998 | Trimberger | 395/500 |
| 5,847,441 | 12/1998 | Cutter et al. | 257/530 |
| 5,847,577 | 12/1998 | Trimberger | 326/38 |
| 5,848,005 | 12/1998 | Cliff et al. | 365/230.03 |
| 5,850,151 | 12/1998 | Cliff et al. | 326/39 |
| 5,850,152 | 12/1998 | Cliff et al. | 326/40 |
| 5,850,564 | 12/1998 | Ting et al. | 395/800.37 |
| 5,852,608 | 12/1998 | Csoppenszky et al. | 365/230.05 |
| 5,859,542 | 1/1999 | Pedersen | 326/39 |
| 5,859,543 | 1/1999 | Kolze | 326/41 |
| 5,859,544 | 1/1999 | Norman | 326/40 |
| 5,861,761 | 1/1999 | Kean | 326/41 |
| 5,869,981 | 2/1999 | Agrawal et al. | 326/39 |
| 5,870,586 | 2/1999 | Baxter | 395/500 |
| 5,880,492 | 3/1999 | Duong et al. | 257/209 |
| 5,880,512 | 3/1999 | Gordon et al. | 257/530 |
| 5,880,597 | 3/1999 | Lee | 326/41 |
| 5,880,598 | 3/1999 | Duong | 326/41 |
| 5,883,526 | 3/1999 | Reddy et al. | 326/41 |
| 5,883,850 | 3/1999 | Lee et al. | 365/230.03 |

FOREIGN PATENT DOCUMENTS

| | | | |
|---|---|---|---|
| 0 415 542 A2 | 7/1990 | European Pat. Off. | H03K 19/173 |
| 0 899 591 A1 | 5/1995 | European Pat. Off. | H03K 19/173 |

*Primary Examiner*—David Nelms
*Assistant Examiner*—Anh Phung
*Attorney, Agent, or Firm*—Jonathan H. Schafer

[57] ABSTRACT

A dual ported (simultaneous read/write) SRAM block with an additional load port that interacts with the circuitry employed in the loading and testing of the configuration data of the FPGA core is disclosed. Each SRAM block contains circuits in both the read port and the write port that permit the SRAM blocks to be connected into deeper and wider configurations by without any additional logic as required by the prior art. An address collision detector is provided such that when both read and write ports in the SRAM block access the same address simultaneously a choice between the data being read can be made between the data presently in the SRAM block or the new data being written to the SRAM block.

3 Claims, 9 Drawing Sheets

EMBEDDED STATIC RANDOM ACCESS MEMORY FOR FIELD PROGRAMMABLE GATE ARRAY

BACKGROUND OF THE INVENTION

1. Field of the Invention

The present invention is related to a field programmable gate array (FPGA) architecture. More particularly, the present invention is related to an FPGA having embedded static random access memory (SRAM).

2. The Prior Art

As integrated circuit technology advances, geometries shrink, performance improves, and densities increase. This trend makes feasible the design of systems of ever increasing complexity at ever decreasing cost. This is especially true in logic products such as Application Specific Integrated Circuits (ASICs), Complex Programmable Logic Devices (CPLDs), and Field Programmable Gate Arrays (FPGAs).

The need for integrating fast, flexible, inexpensive memory into these logic products to provide memory for a variety of purposes such as register files, FIFOs, scratch pads, look-up tables, etc. has become more apparent, because there are significant cost and performance savings to be obtained by integrating this functionality directly into for example, an FPGA. Typically, the implementation of memory without dedicated SRAM blocks in an FPGA has been done by either providing external SRAM to the FPGA or by using the logic modules, flip-flops and interconnect of the FPGA. Both of these solutions are less than satisfactory.

Using external SRAMs with FPGA designs is undesirable for several reasons. Separate memory chips are expensive, require additional printed circuit board space, and consume I/O pins on the FPGA itself. Also, a separate memory chip is required to implement each memory function, thereby further increasing the cost.

When SRAM is implemented with the logic modules in the FPGA, it requires a substantial amount of the routing and logic resources of the FPGA, because the available logic blocks are used to implement gates and latches and the programmable interconnect is employed to connect them. This substantially degrades both the performance and flexibility of the FPGA by consuming a considerable amount of logic array resources, and imposes critical paths that are quite long for even a small memory block.

Xilinx offers the capability of using the configurable logic blocks on its 4000 Series of parts as 16×1 SRAM blocks, but requires the use of normal interconnect to combine the blocks into larger memory configurations. While this distributed SRAM approach is an improvement in density and is flexible for building larger memories, it is still slow and consumes logic array resources. The necessary overhead circuitry was sufficiently large that Xilinx actually removed it when it developed its low cost 4000-D parts. On its 4000 E Series parts, Xilinx also offers the ability to configure two configurable logic blocks to emulate a dual ported 16×1 SRAM block, however, this design still carries with it performance and flexibility degradation.

However, providing memory by having other than explicitly dedicated SRAM blocks included in the FPGA has not proved satisfactory. One approach to providing SRAM memory in FPGA applications is found in "Architecture of Centralized Field-Configurable Memory", Steven J. E. Wilton, et. al., from the minutes of the 1995 FPGA Symposium, p. 97. This approach involves a large centralized memory which can be incorporated into an FPGA. The centralized memory comprises several SRAM arrays which have programmable local routing interconnect which are used exclusively by the centralized memory block. The local routing interconnects are used to make efficient the configuration of the SRAMs within the centralized memory block. However, the local interconnect structure disclosed in Wilton suffers performance problems due to excessive flexibility in the interconnect architecture.

Altera has also attempted to improve on the connection of the SRAM blocks in its embedded array blocks for their 10K FLEX parts. Altera includes a column and/or multiple columns on its larger parts of embedded array blocks which are size matched to their logic array blocks. The embedded array blocks contain 2K bits of single ported SRAM configurable as 256×8, 512×4, 1024×2, or 2048×1. This approach builds the flexibility of different widths and depths into the SRAM block, but at a significant performance cost since the access time of an embedded array block is very slow for a memory of the size and the technology in which it is built.

One of the significant issues in providing SRAM blocks in an FPGA architecture is the ability to connect these blocks to one another to form memories that either include more words (greater depth) than in a single block or have a longer word length (greater width) than in a single block. In connecting SRAM blocks into deeper and wider configurations it must be appreciated that the addresses have to go to each of the SRAM blocks, the data has to go to each of the SRAM blocks, and the data must be able to be read from all of the SRAM blocks. In addition, the control signals used by the SRAM blocks to read and write data must also be routed to each of the SRAM blocks.

Since routing resources must be used to connect the dedicated SRAM blocks to one another to create either wider or deeper memories, and given that routing resources are not unlimited, preventing a degradation in the performance of the FPGA by efficiently forming deeper and wider memories is an important concern. In preventing a degradation of the FPGA performance, the transparent connection to the user of SRAM blocks to provide deeper and wider memory configurations should not substantially impact the place and route algorithms of the FPGA, nor prevent the use of place and route algorithms for connecting the logic in the FPGA.

Actel's 3200 DX family of parts attempted an intermediate approach by including columns of dual ported SRAM blocks with 256 bits which are configurable as either 32×8 or 64×4. These blocks are distributed over several rows of logic modules to match the density of I/O signals to the SRAM block to that of the surrounding FPGA array.

Polarity control circuits were added to the block enable signals to facilitate use as higher address bits. This architecture was designed to provide high performance and reasonable flexibility, with density approaching the inherent SRAM density of the semiconductor process, and routing density comparable to the rest of the logic array. Unfortunately, this approach required array routing resources to interconnect SRAM blocks into deeper and wider configurations.

Further, one of the problems associated with using a dual ported SRAM, is the behavior of the dual ported SRAM when both the read and write ports simultaneously access the same address. There are known approaches that can be taken when simultaneous access to both the read and the write ports occurs. In a first approach, the data in the SRAM prior to the write is held in the sense amplifier latch of the read port. In a second approach, the data being written is fed through the SRAM to be read simultaneously. In the first approach, the data being read is the data present in the SRAM prior to the write, while in the second approach, the data being read is the same as the data being written. Since the SRAM may be employed for a variety of uses by the end user, such as those described above, the flexibility of the FPGA to be programmed for either approach is a desirable attribute.

When one of the uses of the embedded SRAM blocks is to provide data which remains fixed, such as a look-up table, it is important to be able to minimize the routing resources employed to load the data into the SRAM, and then to periodically test the data in the SRAM to ensure that it is reliable. Testing the fixed data stored in the SRAM is of critical concern, because in high reliability applications the undetected occurrence of a changed bit is not considered acceptable. The reluctance among design engineers to use SRAM based FPGA's in high reliability applications such as space, aeronautics, and military equipment due to the vulnerability to SEU's in harsh environments is well known.

It is therefore an object of the present invention to provide an SRAM block for an SRAM interconnect architecture that may be connected into deeper and wider SRAM memory configurations without employing the routing resources provided for the logic modules in an FPGA.

It is a further object of the present invention, to provide enable lines to an SRAM block for connecting the SRAM block into deeper and wider configurations.

It is a further object of the present invention to provide outputs from the an SRAM block that can set to a high impedance state so that the SRAM blocks may be connected into deeper and wider memories.

It is a further object of the present invention to provide an additional load and test port to a dual ported SRAM block to interact with the load and test circuitry for the configuration SRAM of an FPGA.

It is a further object of the present invention to provide an address collision detector to resolve the conflict between the timing signals when both the read port and the write port of an SRAM block are accessed close to simultaneously.

It is yet another object of the present invention to provide an SRAM block for an FPGA including a sense amplifier that provides for shifting the duration of the read access time between the set-up time and the clock-to-out time.

BRIEF DESCRIPTION OF THE INVENTION

According to the present invention, a dual ported (simultaneous read/write) SRAM block with an additional load port that interacts with the circuitry employed in the loading and testing of the configuration data of the FPGA core is disclosed. Each SRAM block contains circuits in both the read port and the write port that permit the SRAM blocks to be connected into deeper and wider configurations by without any additional logic as required by the prior art.

According to another aspect of the present invention, an address collision detector is provided such that when both read and write ports in the SRAM block access the same address simultaneously a choice between the data being read can be made between the data presently in the SRAM block or the new data being written to the SRAM block.

In a preferred embodiment, there eight fully independent blocks of 2K bit SRAM blocks, wherein each SRAM block is organized as 256 words of 8 bits, disposed between two upper multiple logic arrays and the two lower multiple logic arrays. The eight SRAM blocks are further divided into two groups such that the SRAM blocks in each of the groups are substantially contiguous to the extent that the address busses, data busses, and control signal lines of each of the user-configurable SRAM blocks in a group can be commonly connected by user-programmable elements at their edges to facilitate directly combining the user-configurable SRAM blocks in a group into wider and/or deeper user-assignable memory configurations.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
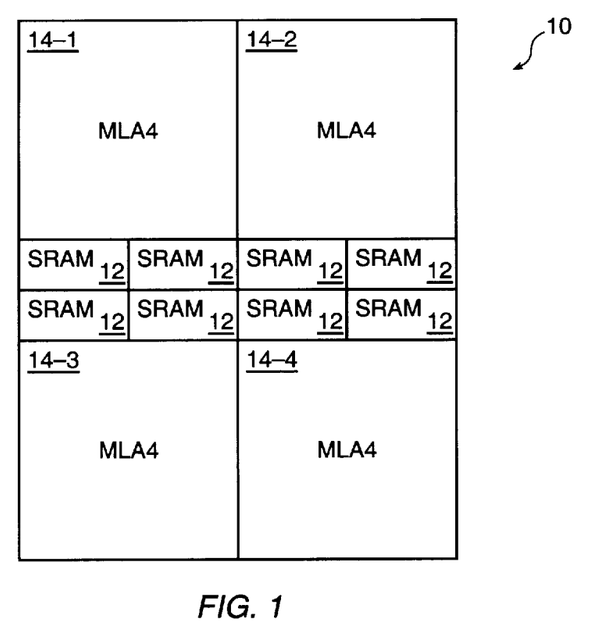
FIG. 1 is a block diagram of an SRAM based FPGA core according to the present invention.

According to the present invention, in FIG. 1 a block diagram of the FPGA core 10 in a flexible, high-performance SRAM based FPGA architecture having user-assignable SRAM blocks 12 according to the present invention is illustrated. The FPGA core 10 includes a plurality of logic function modules disposed within a multi-level architecture (MLA) of routing resources. The blocks 14-1 through 14-4 in FPGA core 10 illustrate a grouping of logic modules in the MLA termed MLA4. In the preferred embodiment, there are approximately 50K gates combined in blocks 14-1 through 14-4. The SRAM blocks 12 comprise 16K bits of user-assignable SRAM divided into eight dedicated blocks of 2K bits. The user-assignable SRAM blocks 12 will be more fully described below.

Figure 2:
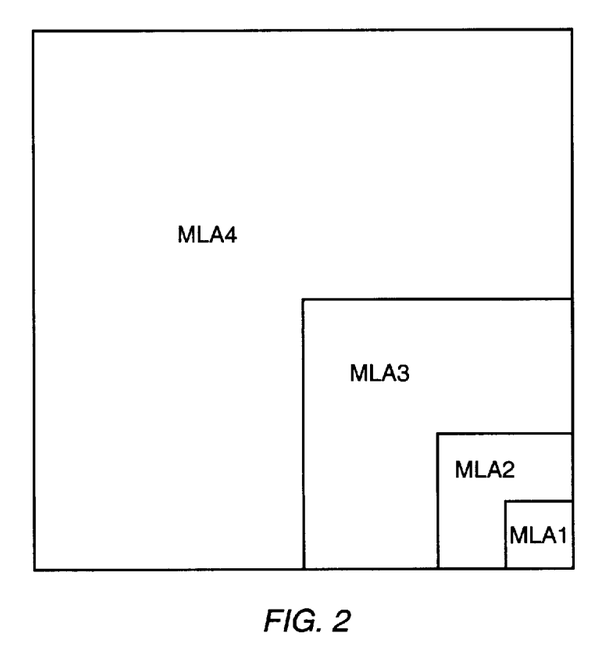
FIG. 2 illustrates a hierarchical embodiment of multiple logic arrays according to the present invention.

Depicted in FIG. 2, are the relative number of logic modules included in each of the routing resource levels MLA1, MLA2, MLA3, and MLA4 in the MLA. In the grouping of logic modules in the MLA, each level in the MLA includes four groups of logic modules from the next lower level in the MLA. The highest level in the MLA is MLA5 comprising all of the logic modules in the FPGA core 10, the SRAM blocks 14, the configuration SRAM, and other circuits in the FPGA.

Figure 3:
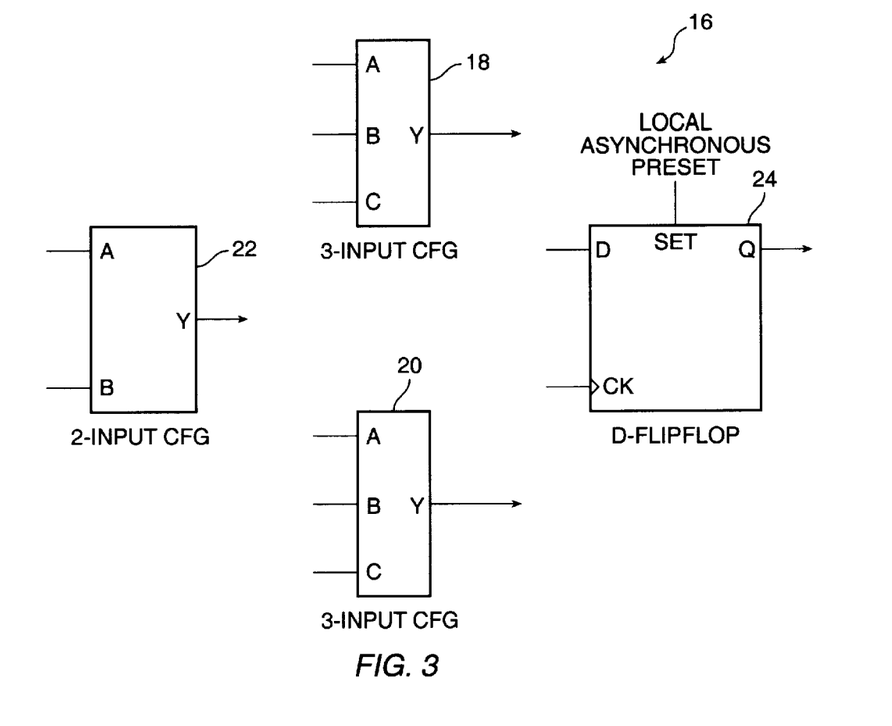
FIG. 3 is a block diagram illustrating the logic entities included in a logic module suitable for use according to the present invention.

The smallest grouping of logic modules is a level MLA 1 in the MLA. Each MLA 1 level includes four blocks each having four clusters. Each of the clusters can be considered as a logic module having four separate logic entities. FIG. 3, illustrates the logic included in a cluster 16 are illustrated. The cluster 16 includes first and second three-input configurable function generators (CFG) 18 and 20, respectively, a two-input CFG 22, and a D-type flip-flop 24. With a three input CFG any three input boolean logic function may be implemented, and with a two input CFG any two input boolean logic function may be implemented. To avoid overcomplicating the disclosure and thereby obscuring the present invention, many of the details of the entire MLA are not disclosed herein.

Referring again to FIG. 1, each user-assignable SRAM block 12 includes 256 words of 8 bits, and each user-assignable SRAM block 12 is fully independent from the other SRAM blocks 12. The eight bits of addressing for each word in an SRAM block 12, and the eight bit word length are convenient for connection to the blocks 14-1 through 14-4. It will be appreciated by persons of ordinary skill in the art that SRAM blocks 12 which are either larger or smaller than 2k bits may be utilized, and further that either fewer or greater than eight SRAM blocks 12 may be employed. The number of words in an SRAM block 12, the length of a word in an SRAM block 12, the number of bits in an SRAM block 12, and the number of SRAM blocks 12 are a matter of design choice.

In the FPGA core 10, the SRAM blocks 12 are preferably split into two groups of four SRAM blocks 12. It should be appreciated that the number of SRAM blocks in a group is a matter of design choice. A first group of four SRAM blocks 12 is disposed between MLA4 blocks 14-1 and 14-3, and a second group of four SRAM blocks 12 is disposed between MLA4 blocks 14-2 and 14-4. The SRAM blocks 12 in each of the groups are substantially contiguous to the extent that the address busses, data busses, and control signal lines of each of the SRAM blocks 12 in a group can be commonly connected to facilitate directly combining the SRAM blocks 12 in a group into wider and/or deeper user-assignable memory configurations. Further, the two groups can be connected together, if desired, through the logic modules and the general interconnect resources of the MLA.

Figure 4:
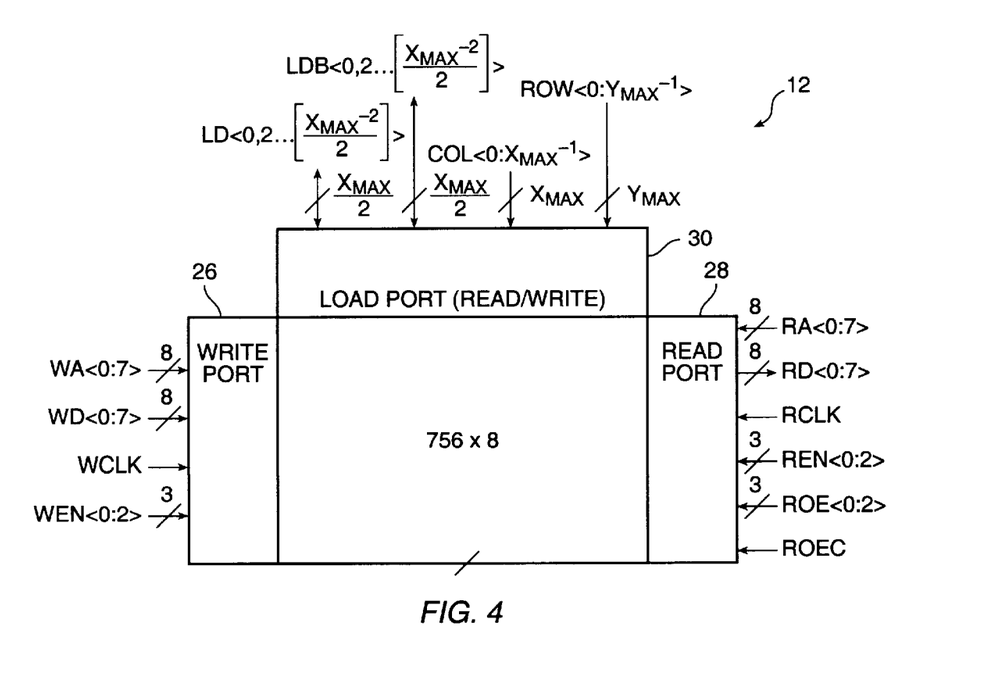
FIG. 4 is a block diagram illustrating an SRAM block depicting a write port, read port and load port suitable for use according to the present invention.

Referring now to FIG. 4, each SRAM block 12 is depicted as dual ported SRAM having write and read ports 26 and 28, respectively. Connected to write port 26 are an eight-bit write address (WA) bus, an eight-bit write data (WD) bus, a write clock (WCLK) input, and a three-bit write enable (WEN) bus. Connected to the read port 28 are an eight-bit read address (RA) bus, an eight-bit read data (RD) bus, a read clock (RCLK) input, a three-bit read enable (REN) bus, a three-bit read output enable (ROE) bus, and read output enable control (ROEC) input. Each of the control signal lines, namely, WCLK, WEN, RCLK, REN, ROE, ROEC, have a well known in-line inverter, comprising an XNOR gate and a polarity control bit as is well known in the art and as is described below with respect to FIG. 7, that may be selected to provide a connected signal or its complement.

Also depicted in FIG. 4 is a load port 30 having connected thereto a column address bus, a row address bus, a LD bus, and a LDB bus. The load port 30 is controlled by the circuitry employed to load the configuration data into the configuration SRAM of the FPGA core 10. During the normal operation of the FPGA 10, the configuration data can be cycled out of the configuration SRAM for testing by cyclical redundancy checking (CRC) circuitry to determine whether an error in the data stored in the configuration SRAM has occurred.

It should be appreciated that the user-assignable SRAM blocks 12 do not contain any of the configuration data. However, through the load port 30, the user-assignable SRAM blocks 12 can be initialized with data during the configuration of the FPGA 10. Once loaded, the fixed data can also be cycled out of the SRAM blocks 12 to be checked by the CRC circuitry. The circuits for loading and cycling data out of the SRAM blocks 12 through the load port 30 according to the present invention will be described below.

To avoid over complicating the present disclosure and obscuring the present invention the details of the circuitry employed in the testing of the fixed data stored in the SRAM blocks 12 will not be disclosed herein. A more detailed description of an SRAM block is 12 disclosed in co-pending application Ser. No. 09/039,924, filed Mar. 16, 1998, the present invention and specifically incorporated herein by reference.

Figure 5:
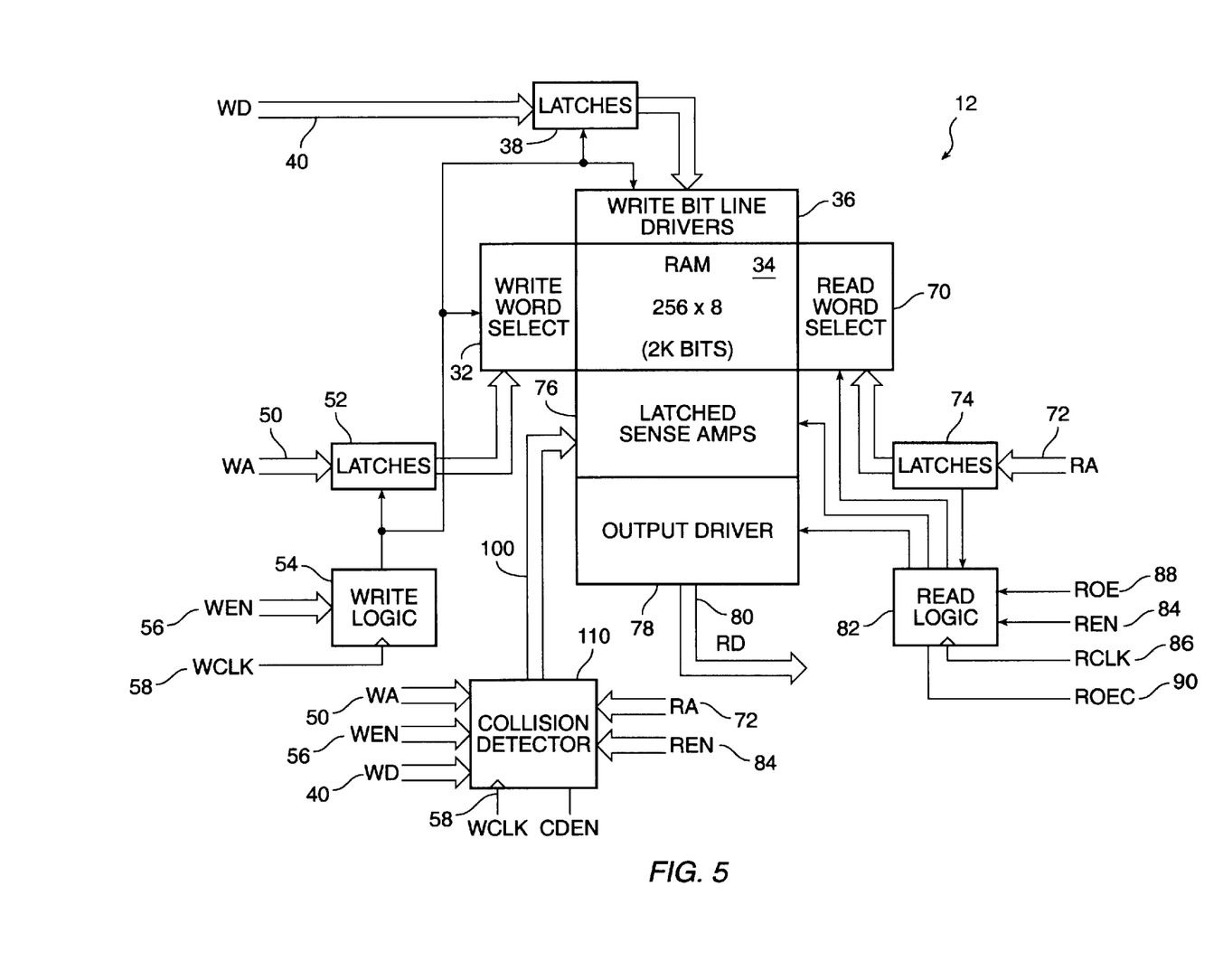
FIG. 5 illustrates a more detailed block diagram of the circuits in the read and write ports depicted in FIG. 4 according to the present invention.

A more detailed block diagram of the read and write ports 26 and 28 of an SRAM block 12 is illustrated in FIG. 5. The SRAM block 12 is dual-ported, permitting simultaneous writes and reads from different addresses. As shown in FIG. 4, the size of the memory is 256 words of eight bits each. An SRAM cell suitable for use according to the present invention is described below with respect to FIG. 14. Dual-porting the SRAM blocks 12 of the present invention is important for attaining high performance, since separating the write port from the read port eliminates write recovery times from the read access path. Also, dual read and write ports make it possible to use the FPGA logic to connect the SRAM blocks to implement a high speed FIFO.

The write port 26 of an SRAM block 12 according to the present invention includes a write word select circuit 32 communicating with a RAM array 34. A row of bit line drivers 36 take the write data from write latches 38 driven by the WD bus 40. The data in write latches 38 is written into an address in RAM array 34 selected by write word select circuit 32 and bit line drivers 36 from the address data present on a 8-bit WA bus 50 which has been latched by write address latch 52.

The write operations are controlled by write logic circuit 54 in accordance with the control signals on the WEN bus 56, and the write clock WCLK input 58. Since, the input data on the WD bus 40, the address on the WA bus 50, and the control signals on the WEN bus 56 are synchronized to the clock signal on the WCLK input 58. A write operation takes place on the appropriate edge of the clock signal supplied to the WCLK input 58 whenever the block is enabled for a write.

It should be appreciated that the WD, WA, WEN and WCLK signal lines may be connected to an SRAM bus architecture by user-programmable interconnect elements. To avoid overcomplicating the disclosure and thereby obscuring the present invention, the details of the SRAM bus architecture are not disclosed herein. These details are disclosed in co-pending application Ser. No. 09/039,923 filed Mar. 16, 1998, and assigned to the assignee of the present invention and specifically incorporated herein by reference.

Figure 6:
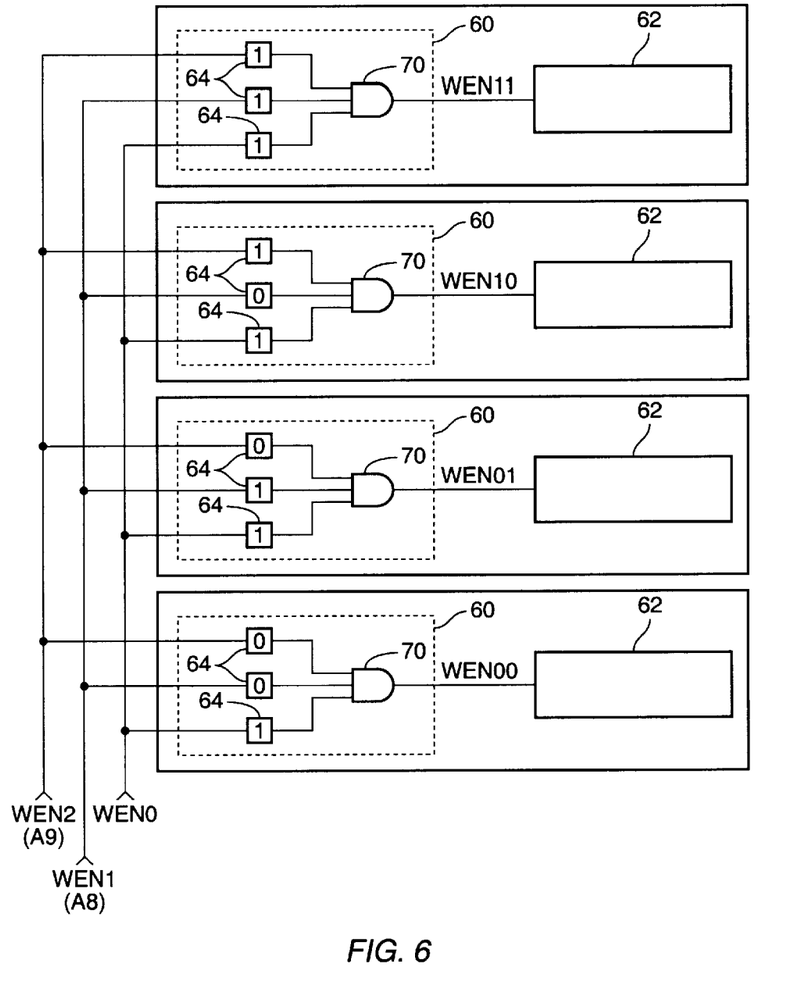
FIG. 6 is a circuit diagram illustrating the enable logic in the write port of the SRAM blocks according to the present invention.

In FIG. 6, four SRAM blocks 12 in a group are illustrated. The enable logic 60 in the write logic 54 of the write port 24 of each of the SRAM blocks 12 to which is connected the WEN control signals has been separated from the remaining portions 62 of the SRAM blocks 12 to better illustrate the manner in which the SRAM blocks 12 may be connected into deeper and wider configurations. Connected to each of the SRAM blocks 12 are three WEN control signals representing the eighth and ninth bits of a write address, and a write enable signal. In each of the SRAM blocks 12, the three WEN control lines are connected to polarity select circuits 64.

Figure 7:
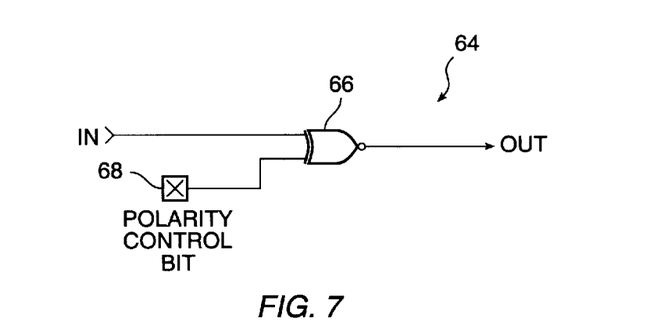
FIG. 7 illustrates a polarity select circuit suitable for use in the present invention.

In the preferred embodiment of the present invention, each of the polarity select circuits 64 comprises an exclusive NOR gate (XNOR) 66 and a polarity control bit 68 as illustrated in FIG. 7. The operation of the exclusive XNOR gate 64 is well understood by those of ordinary skill in the art. Depending upon the value of the polarity control bit 68, the input to the exclusive XNOR gate 66 can either be passed through the exclusive XNOR gate 66 or complimented. The polarity control bit 68 is provided as part of the configuration memory.

In each of the SRAM blocks 12, the AND gates 70 connected to the outputs of the polarity select circuits 64 form an AND decode of the WEN1 and WEN2 signals (eighth and ninth address bits) as is well understood by those of ordinary skill in the art. The output of each of the AND gates 70 provides an internal write enable signal to each of the SRAM blocks 12.

Figure 8:
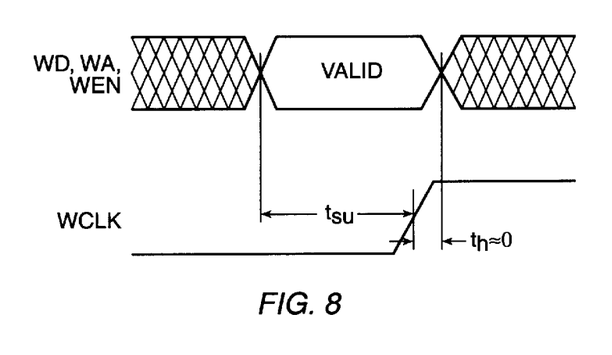
FIG. 8 is a timing diagram showing the timing of the write operation of the SRAM block of FIG. 5.
Figure 9:
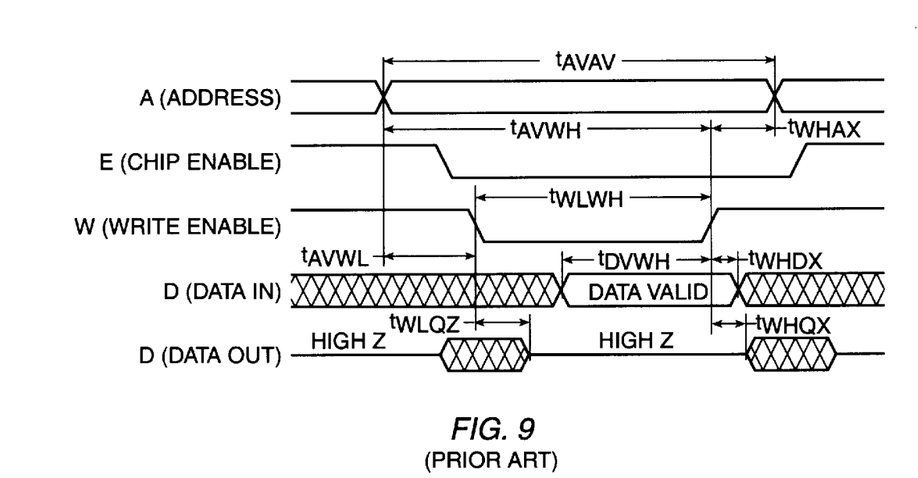
FIG. 9 is a simplified timing diagram showing the typical complex write operation timing of a level-sensitive commercial SRAM integrated circuit, in contrast to the simple timing of the present invention shown the SRAM block of FIG. 8.

Synchronizing the timing of the write port 36 to the WCLK input 58 is important because it simplifies the timing for the user. The illustrative write timing for the user of the SRAM block 12 of the present invention is shown in the timing diagram of FIG. 8. All memories (even asynchronous ones) have write timing requirements because address, data, and control signals must be held constant during the duration of a write pulse or false data may be written into an SRAM block 12. The synchronous write port 26 moves all of the complicated timing relationships, such as the ones normally encountered in SRAM devices of this type as illustrated in FIG. 9, inside the SRAM block 12 relieving the user of the burden of generating a number of timed pulses.

With the synchronous timing of the write port 26, the latches 38 and 52 each effectively perform as master latches to a common slave latch comprising the write word select circuit 32, the bit line drivers 36 and the selected storage elements of the RAM array 34. This gives the write operation the appearance of simply clocking the data into a D-flip/flop on the active edge of WCLK 58 as illustrated in FIG. 7. Both of the latches 38 and 52 are alternately transparent and latched on opposite phases of the clock.

When WCLK input 58 is LOW, latches 38 and 52 are transparent, data is presented to the inputs of the bit line drivers 36 and the location of the data to be written is presented to the inputs of the write word select circuitry 32 and the bit line drivers 36. When WCLK input 58 is brought HIGH, the latches 38 and 52 latch the state of the WD 40 and WA 50 busses, the selected bit line drivers drive the data onto the bit lines of RAM array 34, the write word select circuitry 32 selects the word location where the data is to be stored, and the data is written into the now-transparent latches in the selected memory elements in the RAM array 34. When the WCLK 58 is again brought LOW, the previously selected latches in the RAM array 34 latch the data.

Turning again to FIG. 5, the read port 28 of an SRAM block 12 according to the present invention includes a read word select circuit 71 communicating with the RAM array 34. The address in the RAM array 34 to be read is provided on read address RA bus 72. The read address may be latched into read address latch 71. The read address is output from read address latch 74 and presented to read word select circuit 71 to select the data word to be read from RAM array 34. RAM array 34 drives latched sense amplifiers 76, and sense amplifiers 76 are connected to the output drivers 78 to place data on RD bus 80. The read operations are controlled by the read logic circuit 82 in response to the signals on the REN bus 84, the RCLK input 86, the ROE bus 88, and the ROEC input 90. It should be appreciated that the RD, RA, REN, RCLK, ROE, and ROEC signal lines may be connected to an SRAM bus architecture by user-programmable interconnect elements.

Figure 10:
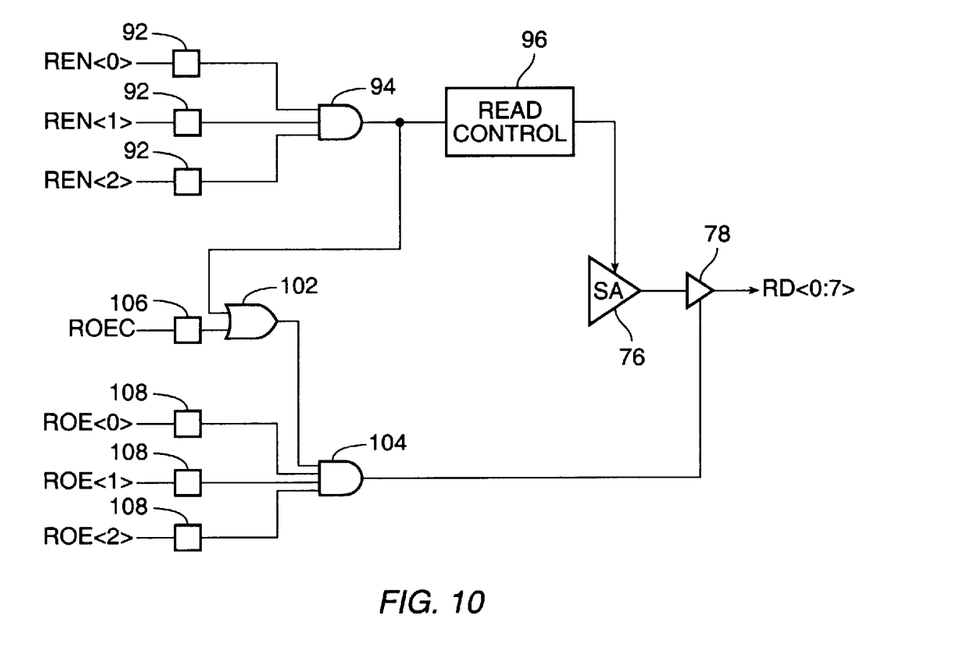
FIG. 10 illustrates the high impedance output and fast access features of the read port in each of the SRAM blocks according to the present invention.

Turning now to FIG. 10, a simplified schematic of a portion of the read logic 82 to which the REN, ROE, and the ROEC signal lines are connected is illustrated. In the illustrated portion of the read logic 82, each of three REN signals are connected to a polarity select circuit 92 similar to the polarity select circuit 64 shown in FIG. 7. The outputs from the polarity select circuits 92 are connected to the input of an AND gate 94. As is well understood by those of ordinary skill in the art, the polarity select circuits 92 and AND gate 94 form an AND decoder for the REN signals.

The output of the AND gate 94 is connected to a read control circuit 96 in the logic 82. One of the outputs of the read control circuit 96 is connected to and controls the enable input to latched sense amplifiers 76. During a read operation to be described below, the sense amplifiers 76, sense the contents of the RAM cells 34 in the SRAM block 12. The outputs of the sense amplifiers 76 are connected to the inputs of output drivers 78. The outputs of output drivers 78 are connected to the RD bus 80. When desired, the output drivers 78 can be placed in a high impedance condition by the output from AND gate 94 connected through a first input of an OR gate 102 and a first input of an AND gate 104 to the enable input of the output driver 78. By including the high impedance feature for the RD bus 80 by placing the output drivers 78 into a high impedance condition, the SRAM blocks 12 can be connected into deeper configurations.

With the high impedance RD bus 80, a fast access mode of operation may be implemented. Since enabling the output drivers 78 is significantly faster than an SRAM read operation, providing a fast enable to the output drivers 78 when a read has previously taken place in the SRAM block 12 can create the illusion of a faster read access than is normally possible. Thus in a deep multiple SRAM block configuration, a read can be conducted in all the SRAM blocks 12 in the configuration and then deft manipulation of the output drivers 78 enables can create an effectively larger output bandwidth.

In FIG. 10 fast access circuitry is illustrated wherein a second input of OR gate 102 is connected to the ROEC input through polarity select circuit 104. The output of OR gate 102 is connected to a first input of AND gate 104 having second, third and fourth inputs connected to the three-bit ROE bus through polarity select circuits 108. In the operation of the fast access mode, the ROEC input is used to force a logic-1 into the first input of the AND gate 104 so the output buffer enable is solely under the control of the ROE bus. In normal operation, the ROEC input and the ROE bus are set up so that the output of the AND gate 94 controls the output drivers 78.

According to a presently preferred embodiment of the invention, the read port 28 may be configured so that a read operation may be performed either asynchronously or synchronously. The latched sense amplifier 76 in an SRAM block 12 is a timed sense amplifier. The timing of the latched sense amplifier 76 is controlled by an address transition detector (ATD) circuit in the read logic 82. The ATD puts out a timed pulse in response to a transition in any of the read address signals.

For the asynchronous read there are latches 74 associated with the RA 72 lines, latches in the read control circuitry 96 depicted in FIG. 10 associated with the output of AND gate 94 connected to the REN lines, and latches in the output driver 78 associated with the RD lines. These latches give the read port 28 during an asynchronous read the feel of a master/slave D-flip/flop. In the synchronous mode, the read address latches 74 and the latches associated with the REN lines are alternately transparent and latched on opposite phases of RCLK 86 and are 180 degrees out of phase relative to the latches in the output driver 78.

Figure 11:
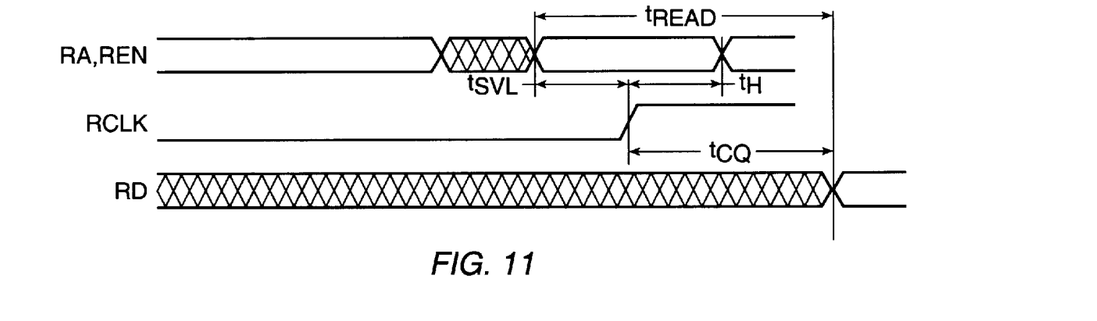
FIG. 11 is a timing diagram illustrating the timing of the synchronous read operation of the SRAM block of FIG. 5.
Figure 13:
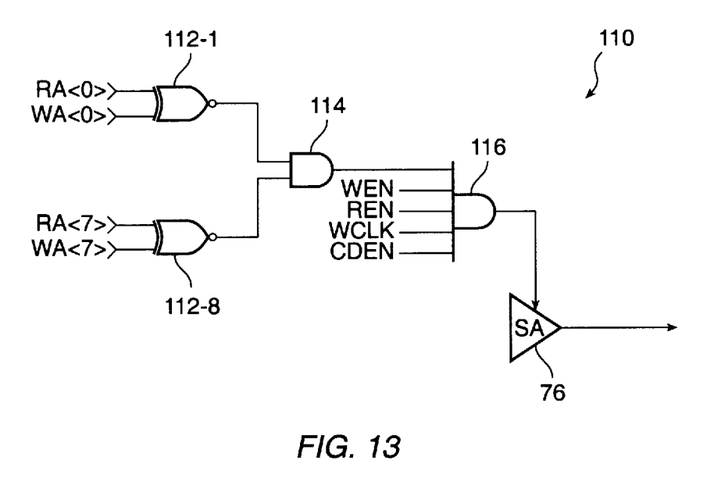
FIG. 13 illustrates an address collision detector circuit according to the present invention.

In FIG. 11, the timing diagram of an synchronous read is illustrated. The read address latch 74 on the RA 72 inputs restrict the operation of the ATD circuit, because when the addresses are latched no transition in the read address is observed. As illustrated in FIG. 13, the read address latches 74 have an intrinsic setup time that must be observed for proper operation. Accordingly, the RA signals must cease transitioning a period of time greater than or equal to the setup time of the latches $t_{SU}$ prior to the active edge of RCLK. At each address transition prior to this setup time, the ATD circuit will trigger the latched sense amplifier. The read will occur a period of time $t_{READ}$ later (though not before the intrinsic clock-to-out of the RD latches $t_{CQ}$). Since $t_{READ}$ is larger than the sum of $t_{SU}$ and $t_{CQ}$, the relative sizes of $t_{SU}$ and $t_{CQ}$ can be traded off against each other to give greater flexibility in a user design.

Figure 12:
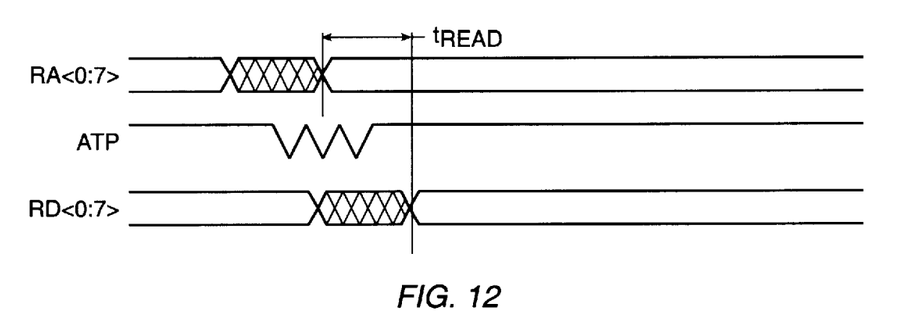
FIG. 12 is a timing diagram illustrating the timing of the asynchronous read operation of the SRAM block of FIG. 5.

The timing diagram of an asynchronous read is shown in FIG. 12. From this timing diagram it can be observed that as the read address changes, several pulses may be output from the ATD circuit, however, it should be appreciated the last read from the final address is the data that will ultimately appear at the SRAM block outputs. When the read port 28 is asynchronous, the latches 74, the latches in the read control circuitry 96, and the latches in the output driver 78 associated with the RD lines 80 are forced transparent. In this latter mode, output data will change in response to a change in the RA, as opposed to changing in response to an edge on RCLK input 86.

One of the system problems associated with using a dual ported SRAM is how it behaves when both read and write ports access the same address simultaneously. When this occurs, the data to be read from the SRAM block 12 is either the data presently in the SRAM block 12 or the new data being written to the SRAM block. In FIG. 13, a collision detector circuit 110 is illustrated which provides for either outcome. In collision detector circuit 110, a bit by bit comparison is made between the RA and the WA by XNOR gates 112-1 through 112-8. When the RA and WA are the same the output of AND gate 114 will be HIGH. The output AND gate 114 is connected to a first input of AND gate 116. Also connected to the inputs of AND gate 116 are the WEN, REN, and CLK signal lines, and a collision detector enable line CDEN.

When the output AND gate 114, WEN, REN, and CLK are all HIGH and the CDEN signal is also HIGH, the collision detector circuit enables the sense amplifier 76 to read the data form the write operation in parallel with the write operation. When CDEN signal is LOW, the write operation takes place, but the data read by the latched sense amplifier 76 is the data that was previously stored in the SRAM block 12.

Figure 14:
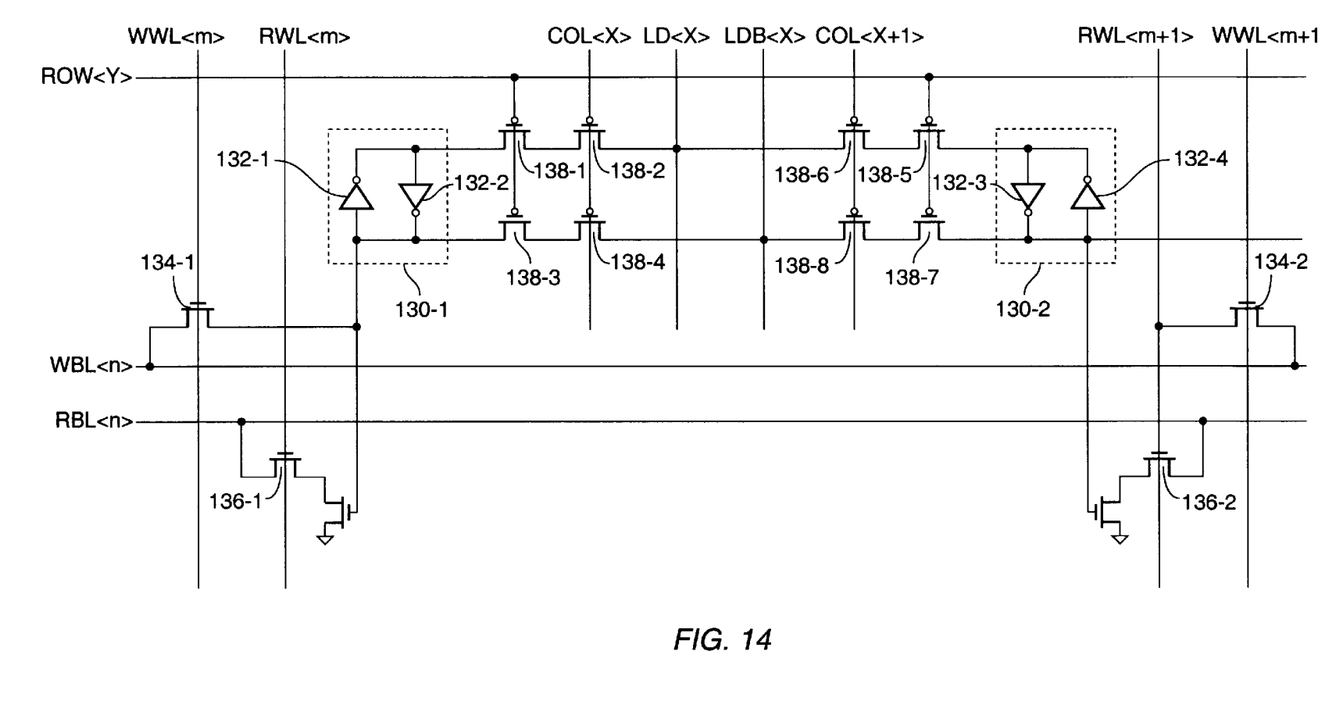
FIG. 14 illustrates a pair of memory cells suitable for use in the present invention.

In FIG. 14, SRAM memory cells 130-1 and 130-2 suitable for use in the present invention are illustrated. In memory cell 130-1, a bit of data is stored in cross-coupled inverters 132-1 and 132-2, and in memory cell 130-2 a bit of data is stored in cross-coupled inverters 132-3 and 132-4. The memory cells 130-1 and 130-2 in an SRAM block may be accessed through the read port 26, the write port 28 or the load port 30 depicted in FIG. 4.

To write to memory cell 130-1 through the write port 26, the write word line, WWL<M> must be brought HIGH to turn on N-Channel MOS transistor 134-1 to place the logic level on write bit line, WBL<N> into the memory cell 130-1, and to write to memory cell 130-2 through the write port 26, the write word line, WWL<M+1> must be brought HIGH to turn on N-Channel MOS transistor 134-2 to place the logic level on write bit line, WBL<N> into the memory cell 130-2. To read from memory cell 130-1 through the read port 28, the read word line, RWL<M> must be brought HIGH to turn on N-Channel MOS transistor 136-1 to place the contents of memory cell 130-1 onto the read bit line, RBL<N>, and to read from memory cell 130-2 through the read port 28, the read word line, RWL<M+1> must be brought HIGH to turn on N-Channel MOS transistor 136-2 to place the contents of memory cell 130-2 onto the read bit line, RBL<N>.

To access memory cell 130-1 through the load port 30 for either a read or a write, ROW <Y> line and COLUMN <X> line must be brought LOW to turn on P-Channel pass transistors 138-1 through 138-4, and to access memory cell 130-2 through the load port 30 for either a read or a write, ROW <Y> line and COLUMN <X+1> line must be brought LOW to turn on P-Channel pass transistors 138-5 through 138-8. Data is written into and read from memory cells 130-1 and 130-2 through the load port 30 on the LD<X> and LDB<X> lines. A simplified circuit diagram for loading data on the LD<X> line and for sensing data on the LDB<X> line through the load port 30 is illustrated in FIG. 15

Figure 15:
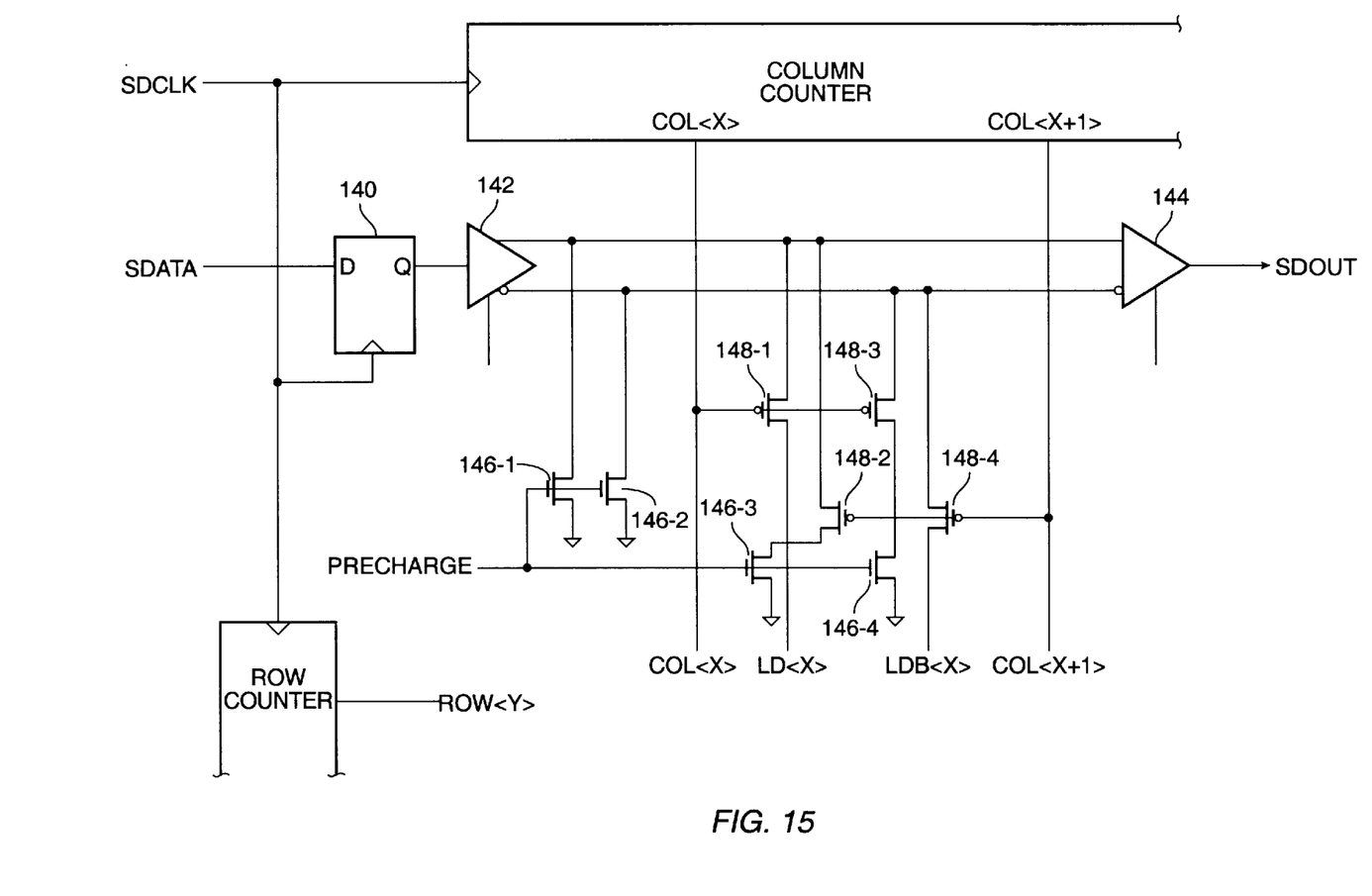
FIG. 15 illustrates a simplified schematic diagram of a circuit for writing the configuration data into and reading the configuration data out of the FPGA core suitable for use according to the present invention.

In FIG. 15, row and column counters for selecting the memory cell from an SRAM 12 through the load port 30, along with a D-type flip-flop 140, a write amplifier 142 and a sense amplifier 144 are illustrated. In FIG. 15, the data to be written through the load port 30 is illustrated as SDATA connected to the data input, D, of D-type flip-flop 140, and the data to be read through load port 30 is illustrated as SDOUT connected to the output of sense amplifier 144.

The data output, Q, of D-type flip-flop 140 is connected to the input of write amplifier 142. A non-inverting output of write amplifier 142 is connected to a non-inverting input of sense amplifier 144, and an inverting output of write amplifier 142 is connected an inverting input of sense amplifier 144. The non-inverting output of write amplifier 142 is also connected to the drain of N-channel MOS pre-charge transistor 146-1, and the drains of P-channel MOS column MUX transistors 148-1 and 148-2. The inverting output of write amplifier 142 is also connected to the drains of N-channel MOS pre-charge transistor 146-2, and the drains of P-channel MOS column MUX transistors 148-3 and 148-4.

The gates and sources of N-channel MOS pre-charge transistors 146-1 through 146-4 are connected to a PRE-CHARGE line and ground, respectively. The drain of N-channel MOS pre-charge transistor 146-3, and the sources of P-channel MOS column MUX transistors 148-1 and 148-2 are connected to the LD<X> line. The drain of N-channel MOS pre-charge transistor 146-4, and the sources of P-channel MOS column MUX transistors 148-3 and 148-4 are connected to the LDB<X> line. The gates of P-channel MOS column MUX transistors 148-1 and 148-3 are connected to the COLUMN<X> line, and the gates of P-channel MOS column MUX transistor 148-2 and 148-4 are connected to the COLUMN<X+1> line.

Read and write operations to and from the SRAM blocks 12 through load port 30 are performed in a two phase manner. In the first phase, occurring during the first half of the cycle of an SDCLK enabling the row and column counters, the common outputs and inputs of the write and sense amplifiers 142 and 144, respectively, and the LD<X> and LDB<X> lines are precharged to ground. In the second phase, occurring during the second half of the SDCLK cycle, the actual read or write operation is performed.

To perform a write, operation the data to be written is clocked into the D-type flip-flop 140 on the rising edge of SDCLK. With the SDCLK signal HIGH, the PRECHARGE is also driven HIGH to drive the common outputs and inputs of the write and sense amplifiers 142 and 144, respectively, and the LD<X> and LDB<X> lines to ground. On the falling edge of the SDCLK signal, the PRECHARGE line goes low to release the common outputs and inputs of the write and sense amplifiers 142 and 144, respectively, and the LD<X> and LDB<X> lines. The COL and ROW lines are asserted at this time to select a single memory cell in an SRAM block 12. The write amplifier 142 drives the appropriate one, dependent upon whether a 1 or a 0 is being written, of the common outputs write amplifier 142 and the associated one of the LD<X> and LDB<X> lines HIGH to perform a write to the selected memory cell of the bit of SDATA stored in the D-type flip-flop 140.

To perform a read operation, with the SDCLK signal HIGH, the PRECHARGE is driven HIGH to drive the common outputs and inputs of the write and sense amplifiers 142 and 144, respectively, and the LD<X> and LDB<X> lines to ground. On the falling edge of the SDCLK signal, the PRECHARGE line goes low to release the common outputs and inputs of the write and sense amplifiers 142 and 144, respectively, and the LD<X> and LDB<X> lines. The COL and ROW lines are asserted at this time to select a single memory cell in the configuration SRAM. The selected cell will pull the appropriate one, dependent upon whether a 1 or a 0 is being read, of the LD<X> and LDB<X> lines and the associated of input of the sense amplifier 144 HIGH to perform a read of the selected memory cell. In the preferred embodiment, the sense amplifier 144 is implemented as two single ended sense amplifers, though other sense amplifier designs could be employed as will be appreciated by those of ordinary skill in the art.

The FPGA architecture described herein offers flexible, high-performance SRAM to the user of FPGAs. The flexibility of the architecture permits efficient implementation of on-chip data storage, register files, and FIFOs. Small-capacity high-speed dual-port SRAM can be used to handle ATM data packets; for DRAM and DMA control; as a "rubber-band" synchronizer between two clocks of differing frequency; and as a coefficient table for FIR and IIR filters (wherein many integer coefficients are stored once and retrieved repeatedly). By offering many independent blocks, the FPGA can support many different sorts of applications. On-chip SRAM is many times more efficient for storing data than logic modules and saves many valuable I/O pins. Thus, the user can fit more logic into, and obtain greater performance from, a given FPGA.

Those of ordinary skill in the art will recognize that the SRAM architecture disclosed herein can also be utilized for FIFO, ROM, and as single port RAM with or without employing a bidirectional data bus.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A dual ported static random access memory block comprising:

a write port having a plurality of write address inputs, a plurality of write data inputs, and a plurality of write enable inputs;

a read port having a plurality of read address inputs, a plurality of read data inputs, a plurality of read enable inputs, a plurality of read output enable control inputs, and a read output enable input; and a write enable circuit in said write port connected to said plurality of write enable inputs, said write enable circuit having a plurality of polarity select circuits, each of said polarity select circuits having an input connected to one of said write enable inputs and an output, and an AND gate having a plurality of inputs and an output, each of said plurality of inputs connected to a separate one of said outputs of said polarity select circuits.

2. A dual ported static random access memory block comprising:

a write port having a plurality of write address inputs, a plurality of write data inputs, and a plurality of write enable inputs;

a read port having a plurality of read address inputs, a plurality of read data inputs, a plurality of read enable inputs, a plurality of read output enable control inputs, and a read output enable input; and a read enable circuit in said read port connected to said plurality of read enable inputs, said read enable circuit having a plurality of select polarity circuits, each of said polarity select circuits having an input connected to one of said read enable inputs and an output, and an AND gate having a plurality of inputs and an output, each of said plurality of inputs connected to a separate one of said outputs of said polarity of select circuits, said out of said AND gate connected to an enable input of a latched sense amplifier connected to said read data outputs.

3. A dual ported static random access memory as in claim 2 further including a read output enable circuit in said read port connected to said plurality of read output enable inputs and said read output enable control input, said read output enable circuit having a second plurality of polarity select circuits, a first one of said second plurality of polarity select circuits having an input connected to the said read output enable control input and an output, each of said second polarity select circuits having an input connected to one of said write output enable inputs and an output, an OR gate having a first input connected to said output of said AND gate, and a second input connected to said output of said first polarity select circuit and an output, and a second AND gate having a plurality of inputs and an output, a first one of said plurality of inputs connected to said output of said OR gate, and remaining ones of said plurality of said inputs connected to a separate one of said outputs of said second plurality of polarity select circuits, and an output connected to said enable circuit said enable input of said latched sense amplifier.

* * * * *